(12) United States Patent
Yamauchi et al.

(10) Patent No.: US 7,796,397 B2
(45) Date of Patent: Sep. 14, 2010

(54) ELECTRONIC COMPONENTS ASSEMBLY AND METHOD FOR PRODUCING SAME

(75) Inventors: Hideaki Yamauchi, Osaka (JP); Masayuki Asai, Osaka (JP); Shuusaku Yamamoto, Osaka (JP); Takashi Sakaguchi, Osaka (JP); Takashi Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 436 days.

(21) Appl. No.: 11/843,290

(22) Filed: Aug. 22, 2007

(65) Prior Publication Data

US 2008/0049408 A1    Feb. 28, 2008

(30) Foreign Application Priority Data

Aug. 23, 2006 (JP) .............................. 2006-226180

(51) Int. Cl.
*H05K 7/00* (2006.01)
(52) U.S. Cl. ...................... 361/760; 361/523; 361/520; 361/535; 361/538; 361/540; 361/772
(58) Field of Classification Search ................. 361/760, 361/761, 748, 738, 782, 821, 830, 763, 433, 361/766, 679.01, 772, 525, 528–534, 513–520, 361/529, 503, 500, 535, 538, 540; 174/260, 174/261, 262
See application file for complete search history.

(56) References Cited

U.S. PATENT DOCUMENTS

| 3,970,903 | A | * | 7/1976 | Shirn | 361/533 |
| 4,070,747 | A | * | 1/1978 | Lambrecht | 29/25.03 |
| 7,133,276 | B2 | * | 11/2006 | Fujii et al. | 361/523 |
| 2004/0233616 | A1 | * | 11/2004 | Arai et al. | 361/523 |
| 2005/0057867 | A1 | * | 3/2005 | Harris et al. | 361/56 |

FOREIGN PATENT DOCUMENTS

JP    07086104    3/1995

* cited by examiner

*Primary Examiner*—Dameon E Levi
*Assistant Examiner*—Hoa C Nguyen
(74) *Attorney, Agent, or Firm*—Dickinson Wright PLLC

(57) ABSTRACT

Provided is an electronic components assembly capable of effectively dealing with unwanted charge accumulated in a capacitor even when general-purpose components are used. An assembly 10 includes an electrolytic capacitor 1, a coil lead 4, and a circuit mounting board 5. The electrolytic capacitor 1 includes a main body 1a, an anode lead 2, and a cathode lead 3. The coil lead 4 is wrapped around the main body 1a. The circuit mounting board 5 has the electrolytic capacitor 1 and the coil lead 4 mounted thereon. The coil lead 4 is connected to a ground of the circuit mounting board 5.

8 Claims, 5 Drawing Sheets

ELECTRONIC COMPONENTS ASSEMBLY AND METHOD FOR PRODUCING SAME

FIELD OF THE INVENTION

The present invention relates to electronic components assemblies in which a capacitor is mounted on a printed-circuit board, and particularly to an electronic components assembly in which unwanted charge accumulated in a capacitor is efficiently drained.

BACKGROUND OF THE INVENTION

Japanese Laid-Open Patent Publication No. 7-86104 discloses an aluminum electrolytic capacitor having a fuse provided therein. This allows the internal fuse to effectively blow even when the anode and cathode of the aluminum electrolytic capacitor are inversely connected to the wrong electrodes on a printed-circuit board, and therefore unwanted charge does not accumulate in the capacitor.

However, the conventional configuration as described above requires such a specialized component as the capacitor including a fuse, leading to an increase in product cost.

BRIEF SUMMARY OF THE INVENTION

An object of the present invention is to provide an electronic components assembly capable of effectively dealing with unwanted charge accumulated in a capacitor even when general-purpose components are used.

The electronic components assembly of the present invention includes: a capacitor having a main body and a connection terminal; a grounding member connected to the main body; and a printed-circuit board on which the capacitor and the grounding member are mounted, and the grounding member is connected to a ground of the printed-circuit board.

Thus, charge that leaks out to the main body surface of the capacitor is emitted through the grounding member to the ground. As a result, the unwanted charge generated in the capacitor can be efficiently emitted.

Here, the grounding member may be wrapped around the main body. Also, the main body may include a constricted portion narrower than other portions of the main body, and the grounding member may be wrapped around the constricted portion. Thus, the grounding member becomes resistant to slippage off the main body of the capacitor.

Also, the grounding member may be a metal wire, or may be composed of nickel-plated stainless steel.

Also, one end of the grounding member and a portion of the connection terminal may be inserted through the same through-hole formed in the printed-circuit board.

Also, the electronic components assembly of the present invention is preferably used for supplying power to a strobe.

Also, the electronic components assembly of the present invention is preferably produced by disposing the main body of the capacitor in an opening of a hollowed conical jig, pressing the grounding member from a side opposite to the opening, thereby attaching the grounding member to the main body, mounting the capacitor and the grounding member on the printed-circuit board, and connecting the grounding member to a ground of the printed-circuit board.

Thus, the present invention makes it possible to effectively deal with unwanted charge accumulated in the capacitor even when general-purpose components are used.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Hereinafter, embodiments of the present invention will be described with reference to FIGS. 1 to 5.

First Embodiment

1. Configuration 1-1. Appearance

Figure 1:
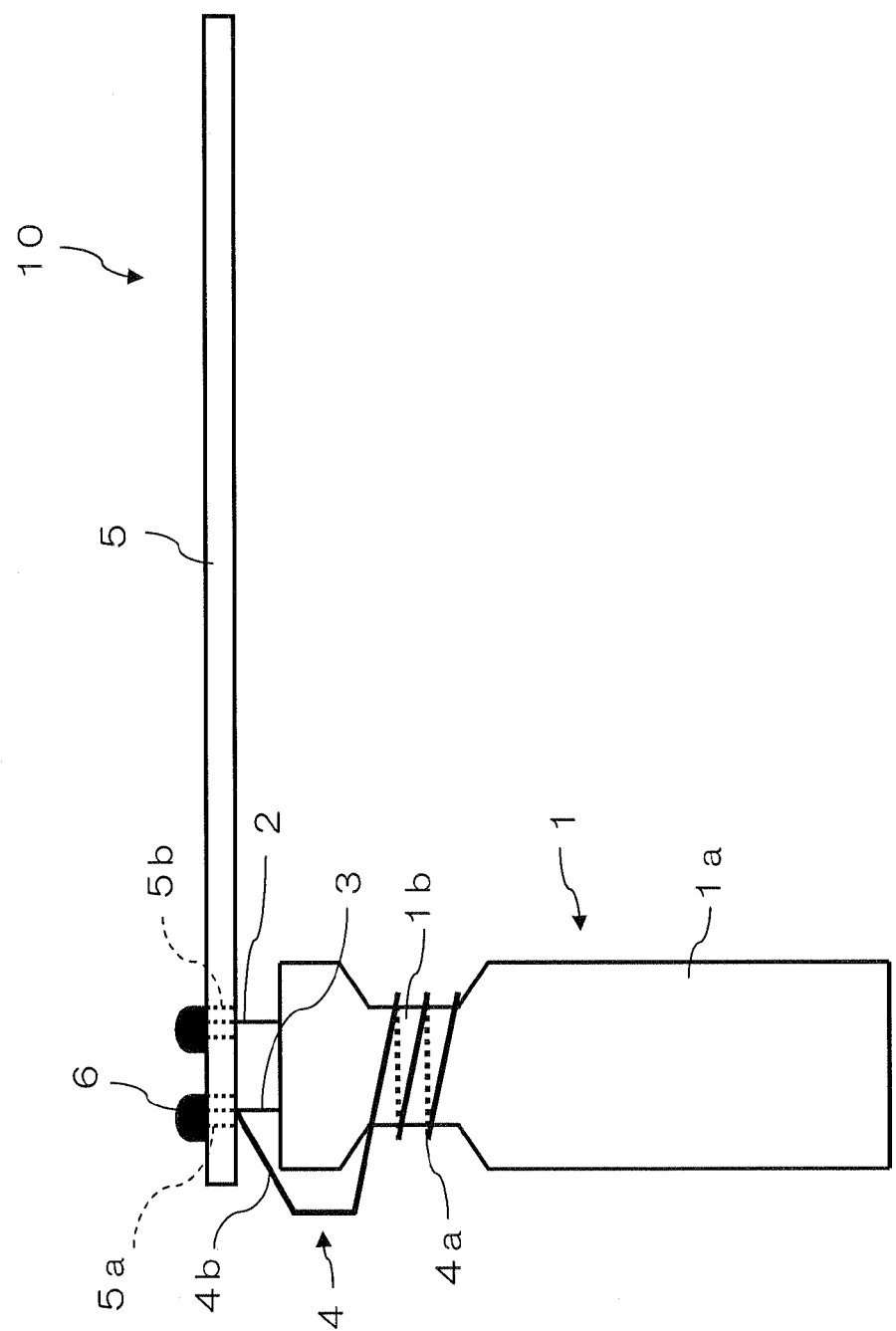
FIG. 1 is a schematic view illustrating the appearance of an electronic components assembly according to a first embodiment of the present invention.

FIG. 1 is a schematic view illustrating the appearance of an electronic components assembly (hereinafter, abbreviated as the "assembly") 10 according to a first embodiment of the present invention. As shown in FIG. 1, the assembly 10 includes an electrolytic capacitor 1, a coil lead 4, a circuit mounting board 5, and soldered portions 6.

The electrolytic capacitor 1 includes a main body 1a, an anode lead 2, and a cathode lead 3. Both the anode lead 2 and the cathode lead 3 protrude from the bottom surface of the main body 1a (shown upside-down in the figure). The cathode lead 3 is inserted through a through-hole 5a formed in the circuit mounting board 5, and soldered to a land (not shown) formed on the circuit mounting board 5. The anode lead 2 is inserted through a through-hole 5b formed in the circuit mounting board 5, and soldered to a land (not shown) formed on the circuit mounting board 5. The electrolytic capacitor 1 is charged with a voltage applied between the anode lead 2 and the cathode lead 3. The main body 1a is in the shape of a cylinder with a laterally constricted portion 1b.

The coil lead 4 is composed of nickel-plated stainless steel. The coil lead 4 is elastic. The coil lead 4 is wrapped at one end around the constricted portion 1b of the electrolytic capacitor 1. In addition, the other end of the coil lead 4, along with the cathode lead 3, is inserted through the through-hole 5a of the circuit mounting board 5, and soldered to the land (not shown) of the circuit mounting board 5.

Although not shown, a camera strobe charge/emission control circuit is formed on the circuit mounting board 5. In addition, the circuit mounting board 5 has wiring patterns formed thereon, at least for grounding and power supply. The wiring pattern for grounding is electrically connected to the cathode lead 3 and the coil lead 4. The wiring pattern for power supply is electrically connected to the anode lead 2.

Any material can be used for the soldered portions 6, so long as it ensures that the anode lead 2, the cathode lead 3, and the coil lead 4 are secured and electrically connected to their respective lands on the circuit mounting board 5. For example, the soldered portions 6 may or may not contain lead. The use of lead-free solder is more environmentally friendly.

1-2. Electrical Configuration

Figure 2:
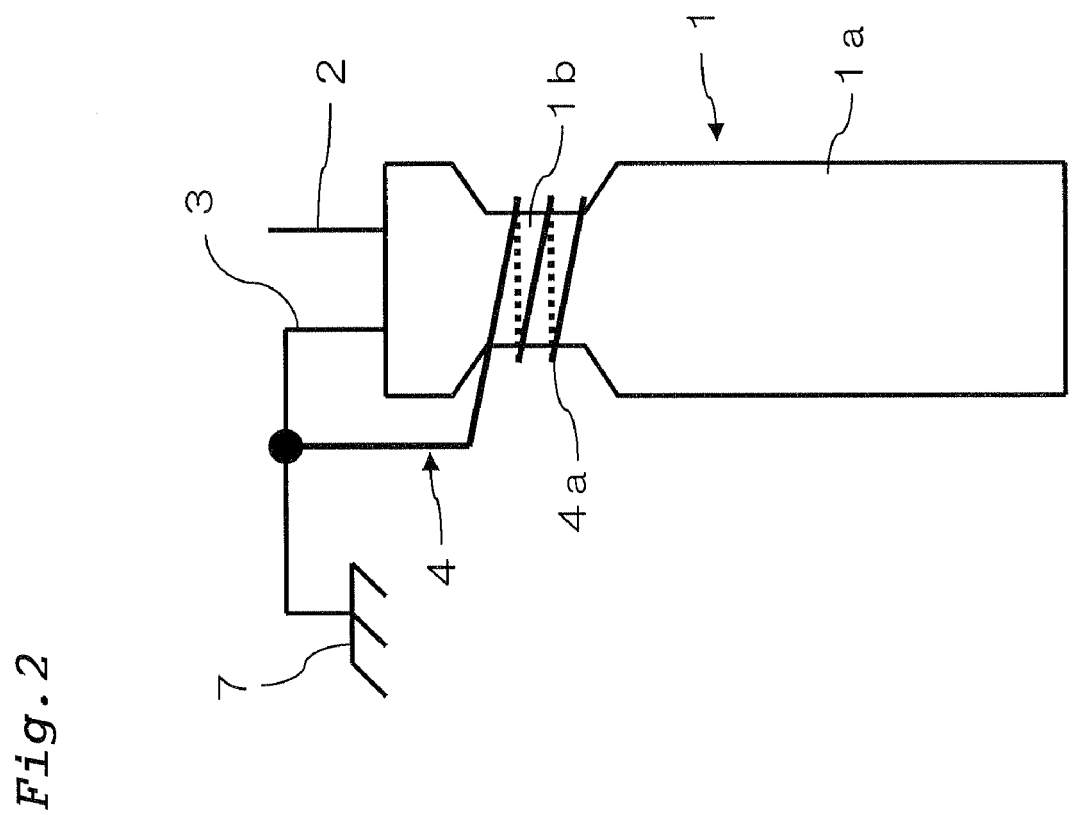
FIG. 2 is a schematic view illustrating the electrical configuration of the electronic components assembly according to the first embodiment of the present invention.

FIG. 2 is a schematic view illustrating the electrolytic capacitor 1 in an electrically connected state. The cathode lead 3 and the coil lead 4 are grounded to a ground 7. Accordingly, even if for some reason charge leaks out to the body surface of the electrolytic capacitor 1, the charge is emitted through the coil lead 4 to the ground 7.

2. Mechanism for Emitting Unwanted Charge

The present invention has an advantage of effectively emitting unwanted charge generated in the electrolytic capacitor 1. The advantage will be described below.

If the electrolytic capacitor 1 is internally fractured, charge accumulated therein might leak out to the surface of the main body 1a. Conceivably, the internal fracture of the electrolytic capacitor 1 occurs due to an excessive current flow to the electrolytic capacitor 1 or overheating of the electrolytic capacitor 1 that is caused by external factors. The excessive current flow to the electrolytic capacitor 1 can occur, for example, when an excessive voltage, excessive ripple, or alternating current is applied to the electrolytic capacitor 1.

In such a case, the charge leaking out to the surface of the main body 1a is emitted through the coil lead 4 to the ground 7.

3. Manufacturing Method

Figure 3:
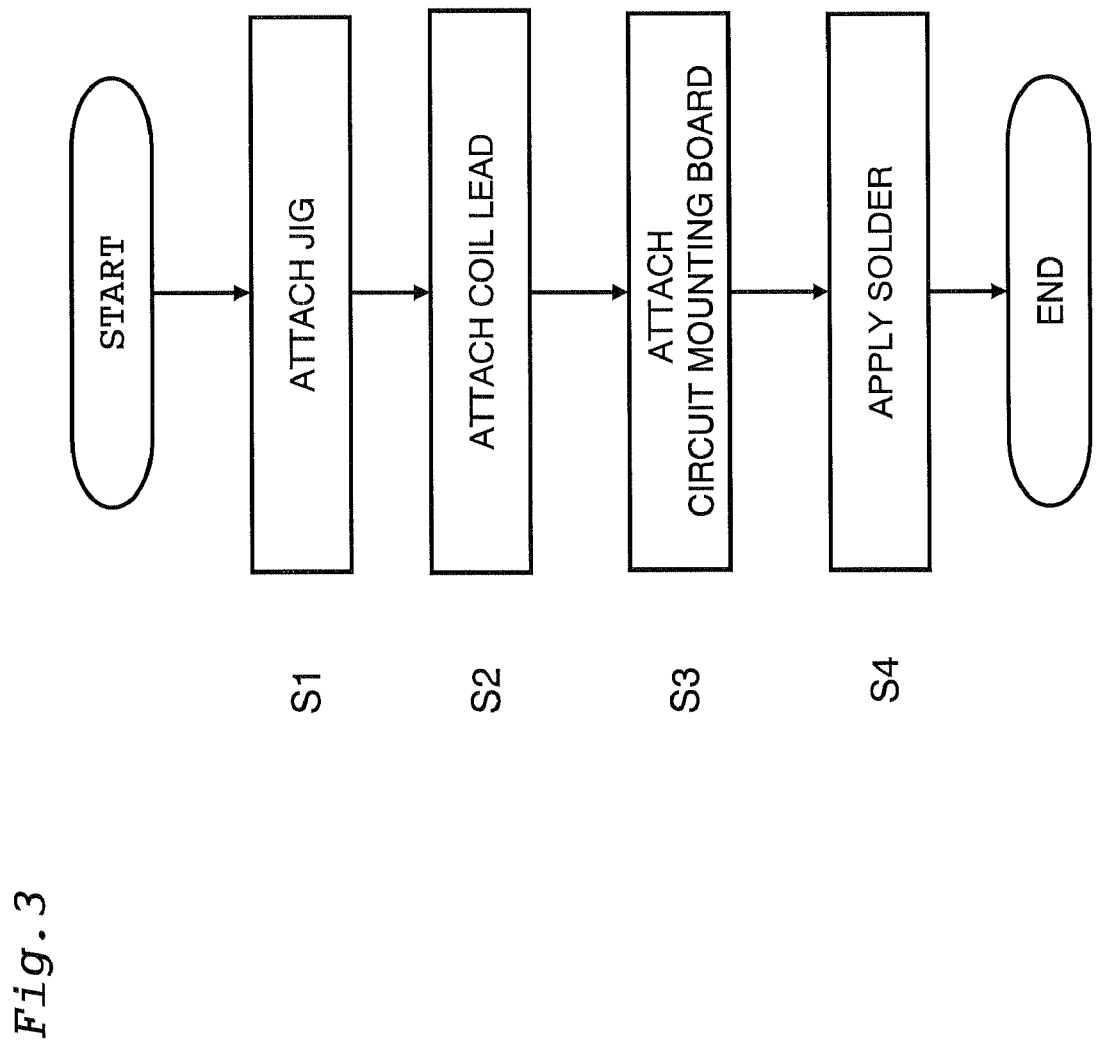
FIG. 3 is a flowchart for explaining a method for manufacturing the electronic components assembly according to the first embodiment of the present invention.
Figure 4:
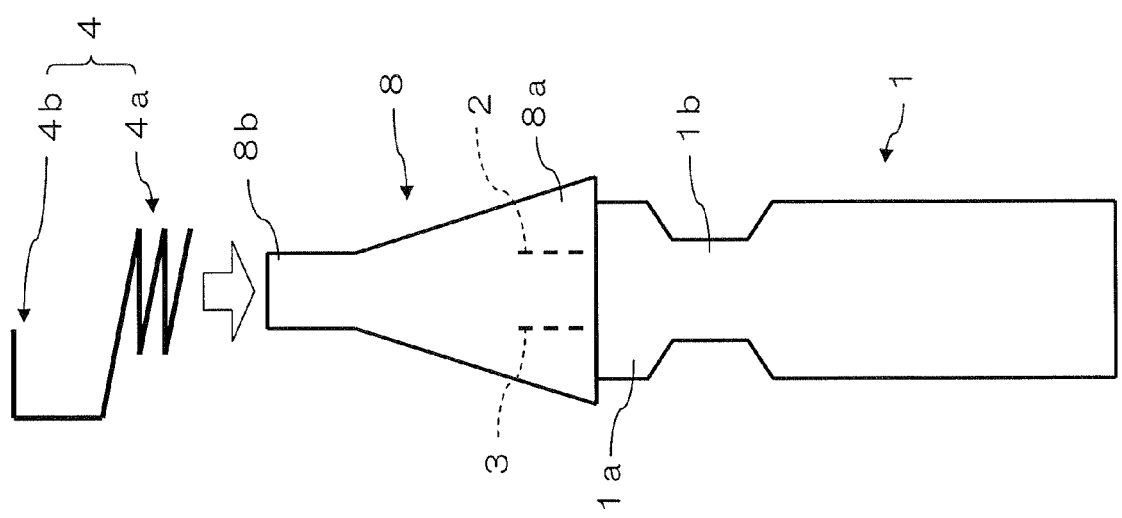
FIG. 4 is a schematic view illustrating how a coil lead is attached to a capacitor according to the first embodiment of the present invention.
Figure 5:
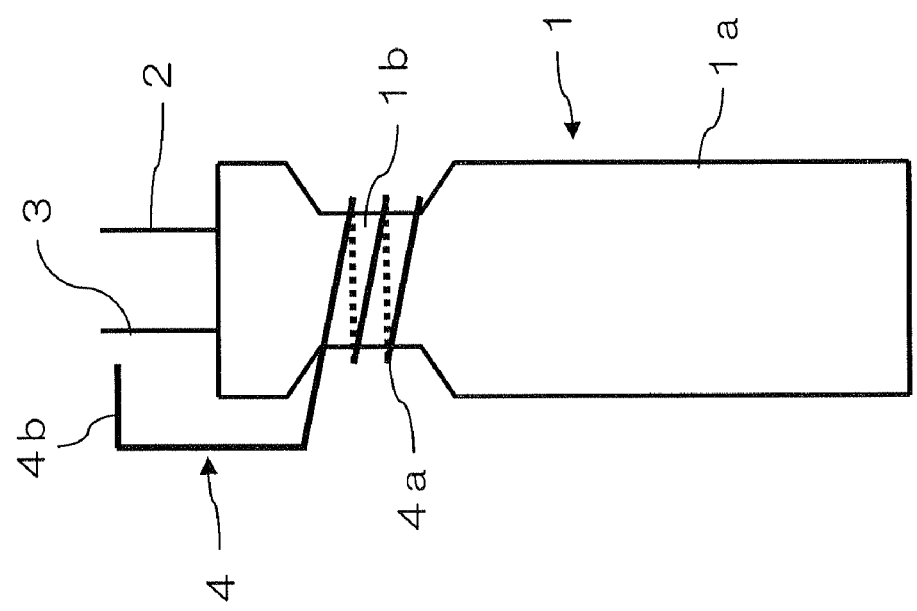
FIG. 5 is a schematic view illustrating the coil lead attached to the capacitor according to the first embodiment of the present invention.

FIG. 3 is a flowchart for explaining a method for manufacturing the assembly 10. FIGS. 4 and 5 are schematic views for explaining some steps of the method for producing the assembly 10.

First, a jig 8 is attached to the electrolytic capacitor 1 (step S1). The jig 8 has a hollowed cone-like shape resembling an ice cream cone. The jig 8 is open at a wider flared bottom portion 8a. A narrower end (hereinafter, referred to as the "upper end") 8b of the jig 8 may or may not be open. The bottom surface of the electrolytic capacitor 1 having the anode lead 2 and the cathode lead 3 formed thereon is pushed into the wider flared opening 8a, so that the jig 8 is attached to the electrolytic capacitor 1.

Next, the coil lead 4 is fitted onto the attached jig 8 by pushing it from the direction of the upper end 8b as indicated by the arrow (step S2). The coil lead 4 has a coil-shaped end portion preformed by a bending process. It is preferable that the diameter of the coil 4a is approximately equal to or slightly smaller than the diameter of the constricted portion 1b. The reason for this is that the coil 4a, when wrapped around the constricted portion 1b, is secured on the constricted portion 1b because of its elastic force. In addition, the upper end 8b of the jig 8 is preferably smaller in diameter than the coil 4a. The reason for this is that if the upper end 8b of the jig 8 is smaller in diameter than the coil 4a, the upper end 8b of the jig 8 can be readily inserted into the coil 4a without forcibly stretching the coil 4a.

After the upper end 8b of the jig 8 is inserted into the coil 4a, the coil 4a is pressed down. As the coil 4a is pressed down, it is forcibly stretched because of its elasticity. Thereafter, the coil 4a is further pressed down beyond the opening 8a so as to wrap around the main body 1a. Thereafter, the coil 4a is further pressed down so as to wrap around the constricted portion 1b. At this time, the coil 4a seeks to restore its original state because of its own elastic force, becoming smaller in diameter. As a result, the coil 4a is secured on the constricted portion 1b.

Thereafter, the jig 8 is removed from the electrolytic capacitor 1. The appearance of the electrolytic capacitor 1 at that time is shown in FIG. 5.

Next, the electrolytic capacitor 1 and the other end 4b of the coil lead 4 are attached to the circuit mounting board 5 (step S3). Specifically, the cathode lead 3 and the coil terminal 4b are inserted through the same through-hole 5a, and the anode lead 2 is inserted through the through-hole 5b. At this time, the electrolytic capacitor 1 may be mounted on the circuit mounting board 5 after other components to be mounted or vice versa. Alternatively, the other components and the electrolytic capacitor 1 may be mounted simultaneously.

Next, the anode lead 2, the cathode lead 3, and the coil terminal 4b are soldered to their respective lands on the circuit mounting board 5 (step S4). Here, the soldering may be carried out by a flow method or a soldering iron.

Thereafter, flux contained in the solder is washed away. Lastly, surplus portions of the anode lead 2, the cathode lead 3 and the coil terminal 4b are trimmed off.

4. The Correspondence Between the Features of the Present Invention and the Features of the Present Embodiment The anode lead 2 and the cathode lead 3 are exemplary connection terminals of the present invention. The electrolytic capacitor 1 is an exemplary capacitor of the present invention. The coil lead 4 is an exemplary grounding member of the present invention. The circuit mounting board 5 is an exemplary printed-circuit board of the present invention.

5. Recapitulation

The assembly 10 according to the present embodiment includes the electrolytic capacitor 1, the coil lead 4, and the circuit mounting board 5. The electrolytic capacitor 1 includes the main body 1a, the anode lead 2, and the cathode lead 3. The coil lead 4 is wrapped around the main body 1a. The circuit mounting board 5 has the electrolytic capacitor 1 and the coil lead 4 mounted thereon. The coil lead 4 is connected to the ground of the circuit mounting board 5. As a result, the charge that leaks out to the surface of the main body 1a is emitted through the coil lead 4 to the ground. Therefore, it is possible to efficiently emit the unwanted charge generated in the electrolytic capacitor 1.

The present invention may be configured as described in the present embodiment. Specifically, the main body 1a may have the constricted portion 1b narrower than other portions, and the coil lead 4 may be wrapped around the constricted portion 1b. As a result, the coil lead 4 becomes resistant to slippage off the main body 1a. In addition, even when the coil lead 4 with the coil 4a having a small diameter is used and it is necessary to thin the portion to which the coil 4a is attached, only the constricted portion 1b, rather than the entirety of the main body 1a, is required to be thinned. Therefore, it is possible to ensure that the electrolytic capacitor 1 has a large capacity.

Also, in the present invention, the grounding member may be a metal wire as described in the present embodiment. The use of the metal wire facilitates grounding and a bending process. Alternatively, the grounding member may be nickel-plated stainless steel. Nickel plating enhances solder wettability. In addition, the use of stainless steel ensures the elasticity of the coil 4a.

Also, in the present embodiment, the assembly 10 is produced by disposing the main body 1a of the electrolytic capacitor 1 in the opening 8a of the hollowed conical jig 8, pressing the coil 4a from the side opposite to the opening 8a so as to be fitted onto the main body 1a, mounting the electrolytic capacitor 1 and the coil lead 4 on the circuit mounting board 5, and connecting the coil lead 4 to the ground of the circuit mounting board 5. As a result, the coil lead 4 can be readily wrapped around the electrolytic capacitor 1. These operations can be relatively easily performed even by inexperienced workers. Therefore, the production steps can be simplified.

Other Embodiments

The present invention can be achieved as illustrated in the first embodiment. However, there are various other possible embodiments of the present invention. Accordingly, some of such other embodiments will be collectively described hereinbelow.

While the electrolytic capacitor 1 is used in the first embodiment, the capacitor of the present invention is not limited thereto. The present invention is applicable to any capacitors, so long as their main bodies are conductive.

Also, in the configuration according to the first embodiment, the main body of the capacitor is conductive and the coil 4a is directly wrapped around the constricted portion 1b, but such a configuration is not restrictive. In the case where a sleeve (film) is wrapped around the main body of the electrolytic capacitor to indicate the product name and specifications, the sleeve may be cut away to reveal the conductive area of the constricted portion 1b and wrap the coil 4a therearound.

Also, in the configuration according to the first embodiment, the coil 4a is wrapped around the constricted portion 1b, but the present invention is not limited to such a configuration, and can be applied to, for example, capacitors having a cylindrical main body as well as capacitors having a slip-resistant portion to which the grounding member is attached. By employing the configuration in which the grounding member is wrapped around the constricted portion, it becomes possible to achieve the aforementioned effect of readily securing the grounding member onto the constricted portion.

Also, in the first embodiment, the coil lead 4 is used as the grounding member of the present invention, but this is not restrictive. The grounding member of the present invention may be, for example, a strip- or frame-shaped wire. That is, any wires can be used so long as they can be wrapped around the main body of the capacitor for the purpose of grounding.

Also, in the first embodiment, the nickel-plated stainless steel is used as the grounding member of the present invention, but the present invention is not limited to such a grounding member. For example, gold may be plated. In addition, depending on circumstances, plating may not be necessary. That is, surface finishing is performed, considering the wettability, etc., of a material (solder or suchlike) for connecting the printed-circuit board with the grounding member. In addition, besides stainless steel, for example, copper may be used as a core material.

Also, in the first embodiment, the coil 4a is wrapped around the electrolytic capacitor 1, but the present invention is not limited thereto, so long as the grounding member can be connected to the capacitor. For example, a portion of the grounding member may be connected to the capacitor by soldering. In addition, the grounding member may be composed of, for example, a wire connected to a ring-shaped member having an opening. In such a case, the ring-shaped member is preferably configured such that its opening can be stretched by elastic deformation. With this configuration, it is possible to fit the ring-shaped member onto the capacitor by taking advantage of the characteristic feature of the ring-shaped member that the stretched opening seeks to return to its original state. Therefore, it is possible to readily attach the grounding member to the capacitor.

Also, in the first embodiment, solder is used as a material for connecting the printed-circuit board and the grounding member, but the present invention is not limited to the use of solder. For example, a conductive paste or suchlike can be used. That is, any materials can be used so long as they can achieve electrical connection.

Also, in the first embodiment, the coil terminal 4b and the cathode lead 3 are inserted through the same through-hole 5a, which requires one through-hole less than in the case where the through-hole is provided for each of the coil terminal 4b and the cathode lead 3, making it possible to reduce the number of stages for processing the circuit mounting board 5. In addition, it is also possible to facilitate mounting of the coil lead 4 and the cathode lead 3, which are inserted through the same through-hole 5a, on the circuit mounting board 5. However, the present invention is not limited to such a configuration. For example, the through-hole may be provided for each of the coil terminal 4b and the cathode lead 3.

Also, in the first embodiment, the assembly 10 can be used for supplying power to a camera strobe. For such an application, it is necessary to mount a high-voltage capacitor, and therefore the present invention is particularly effective. However, the present invention is not limited to such an application, and is applicable to strobe circuits of movie cameras, for example. In addition, the present invention is applicable to power supply circuits of air-conditioners/heaters, as well as control circuits for automobile use.

Also, in the first embodiment, the assembly 10 is produced by wrapping the grounding member, which is processed into the form of a coil, around the main body 1a using the jig 8. However, the present invention is not limited to such a production method. For example, a wire-like grounding member can be wrapped directly around the constricted portion 1b and subjected to a bending process.

The present invention makes it possible to efficiently emit unwanted charge by connecting the grounding member to the main body of the capacitor, and therefore is particularly useful for strobe circuits of cameras, power supply circuits of air-conditioners/heaters, control circuits for automobile use, etc. Furthermore, the present invention is applicable to electric circuits, including control circuits and power supply circuits for other applications.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. An electronic components assembly, comprising:
   a capacitor having a main body and a connection terminal;
   a grounding member connected to the main body; and
   a printed-circuit board on which the capacitor and the grounding member are mounted, wherein
   the grounding member is connected to a ground of the printed-circuit board, the grounding member is wrapped around the main body, thereby being connected to the main body, and the main body includes a constricted portion narrower than other portions of the main body, and the grounding member is wrapped around the constricted portion.

2. The electronic components assembly according to claim 1, wherein the grounding member is a metal wire.

3. The electronic components assembly according to claim 1, wherein the grounding member is composed of nickel-plated stainless steel.

4. A camera using an electronic components assembly of claim 1, for supplying power to a strobe.

5. An electronic components assembly, comprising:
a capacitor having a main body and a connection terminal;
a grounding member connected to the main body; and
a printed-circuit board on which the capacitor and the grounding member are mounted, wherein:
the grounding member is connected to a ground of the printed-circuit board, and
one end of the grounding member and a portion of the connection terminal are inserted through a same through-hole formed in the printed-circuit board.

6. The electronic components assembly according to claim 5, wherein the grounding member is a metal wire.

7. The electronic components assembly according to claim 5, wherein the grounding member is composed of nickel-plated stainless steel.

8. A camera using an electronic components assembly of claim 5, for supplying power to a strobe.

* * * * *